United States Patent [19]

Anderson, Jr. et al.

[11] Patent Number: 4,539,222

[45] Date of Patent: Sep. 3, 1985

[54] PROCESS FOR FORMING METAL PATTERNS WHEREIN METAL IS DEPOSITED ON A THERMALLY DEPOLYMERIZABLE POLYMER AND SELECTIVELY REMOVED

[75] Inventors: Herbert R. Anderson, Jr., Patterson; Constance J. Araps, Wappingers Falls; Catherine A. Lotsko, Beacon, all of N.Y.

[73] Assignee: International Business Machines Corporation, Armonk, N.Y.

[21] Appl. No.: 556,733

[22] Filed: Nov. 30, 1983

[51] Int. Cl.³ .......................................... H01L 21/285
[52] U.S. Cl. ..................................... 427/88; 156/643; 427/96; 427/226; 427/259; 427/91; 427/99; 430/314; 430/329; 430/330
[58] Field of Search ................... 427/226, 259, 88, 91, 427/96, 99; 430/314, 329, 330; 156/643

[56] References Cited

U.S. PATENT DOCUMENTS 3,535,137 10/1970 Haller et al. .
3,934,057 1/1976 Moreau et al. .
3,985,597 10/1976 Zielinski .
4,004,044 1/1977 Franco et al. .
4,181,755 1/1980 Liu et al. .
4,224,361 9/1980 Romankiw ......................... 427/259
4,272,561 6/1981 Rothman et al. ................... 427/259
4,328,263 5/1982 Kurahashi et al. ................. 427/259

OTHER PUBLICATIONS

Gregor et al., "Method for Use and Removal of Photosensitive Chemical Resist Layers" IBM TDB, vol. 7, No. 11, Apr. 1965.
IBM Technical Disclosure Bulletin, "Solventless Development of Polymeric Films" C. A. Cortellino et al., vol. 15, No. 1, Jun. 1972, p. 174.
IBM Technical Disclosure Bulletin, vol. 22, No. 2, Jul. 1979, pp. 541 and 542.
Photoresist Materials and Process, W. S. DeForest, McGraw-Hill, pp. 24, 25, 28, 29 and 60 (1975).

*Primary Examiner*—John D. Smith
*Attorney, Agent, or Firm*—Sughrue, Mion, Zinn, Macpeak, and Seas

[57] ABSTRACT

A process for forming a desired metal pattern on a substrate which comprises forming a mask of a thermally depolymerizable polymer on the substrate with a pattern of openings complementary to the desired metal pattern, blanket coating the substrate and the mask with a metal, heating to depolymerize the thermally depolymerizable polymer, and removing the thermally depolymerizable polymer and metal thereover in a mild solvent.

27 Claims, 1 Drawing Figure

PROCESS FOR FORMING METAL PATTERNS WHEREIN METAL IS DEPOSITED ON A THERMALLY DEPOLYMERIZABLE POLYMER AND SELECTIVELY REMOVED

BACKGROUND OF THE INVENTION

1. Field of the Invention

The present invention relates to a process for forming metal patterns on a substrate where a thermally depolymerizable polymer is used as a lift-off or release layer for a blanket metallization layer.

2. Description of the Prior Art

IBM Technical Disclosure Bulletin Vol. 22, No. 2, July 1979, pages 541 and 542 disclose, respectively, the use of gamma radiation treatment to enhance unzipping and the use of poly-α-methylstyrene and polymethylmethacrylate as unzippable polymers for green sheets.

IBM Technical Disclosure Vol. 15, No. 1, June 1972, page 174, discloses inter alia, polymethylmethacrylate electron beam resists where heating is used to bring out the image rather than developing in a solvent.

U.S. Pat. No. 3,535,137, Haller et al, discloses a method for manufacturing electron beam degradable, etch-resistant, positive resist masks from vinyl-type polymers and copolymers in which one-half the carbon atoms of the main chain are quaternary such as polymethyl methacrylate or cellulose derivatives such as cellulose acetate. Areas of the mask exposed to electron beam radiation are reduced in molecular weight and can be developed by an in situ fractionation step. Prior to irradiation the polymer film is baked to improve adhesion and handling characteristics.

U.S. Pat. No. 3,985,597 Zielinski discloses a wet lift-off system based upon the use of a solvent where polysulfone is dissolved out in N-methyl pyrrolidone.

U.S. Pat. No. 3,934,057, Moreau et al, relates to a high sensitivity positive resist and mask formation process. The resist comprises plural layers of resist coated on a substrate. Each resist layer includes a radiation degradable organic polymer and each successive resist layer has a lower dissolution rate in the resist developer than the resist layer which it overlies. Useful resists include vinyl type polymers such as lower alkyl esters of methacrylate, n-butylmethacrylate and t-butylmethacrylate, and diazo sensitized novolac resins.

U.S. Pat. No. 4,004,044 Franco et al discloses a wet method for forming patterned films utilizing a transparent lift-off mask where a photoresist layer is removed in a solvent such as N-methyl pyrrolidone.

U.S. Pat. No. 4,181,755 Liu et al discloses a wet method for generating thin film patterns by an inverse lift-off technique which involves soaking in an appropriate photoresist solvent.

U.S. Pat. No. 4,224,361 Romankiw discloses a high temperature lift-off technique.

U.S. Pat. No. 4,272,561 Rothman et al discloses a solvent-based wet lift-off technique used in the fabrication of integrated circuits.

U.S. Pat. No. 4,328,263 Kurahasi et al discloses a process for manufacturing semiconductor devices where a solvent-based wet lift-off technique is used.

The process of the present invention finds application in any of the above processes where a metallization layer is removed.

The present invention avoids the disadvantages of currently used wet procedures which involve exposure to strong solvents such as NMP for extended periods of time at elevated temperatures.

For example, per the prior art wet procedures, if a lift-off layer comprises a polysulfone, the same is typically removed by soaking in hot N-methyl pyrrolidone (NMP) for 8–18 hours at elevated temperatures, e.g., 85°–130° C. The solvent swells and dissolves the polymeric polysulfone layer and removes the overlying metal film, leaving behind the desired metallization pattern, e.g., metallized vias. Certain devices employ organic insulators in the structure such as a polyimide in place of the inorganic insulators. Problems encountered with this particular system using polysulfone as a lift-off layer include: (1) long soak times in hot NMP; (2) moderately polar, strong solvents such as NMP readily swell organic polymers such as polyimides, the resulting volume increase causes stressing and cracking of contiguous RIE barrier layers such as $Si_3N_4$; (3) polymers such as polyimides readily absorb NMP even at room temperature, which is then extremely difficult to remove from the device and can lead to outgassing problems and result in ill-shaped metallurgy as well as corroded metallurgy; (4) polysulfone is sensitive to electron beam radiation which apparently leads to crosslinking, resulting in reduced solubility and requiring longer NMP soak times to effect lift-off, resulting in solvent-resistant residues; and (5) swelling can result in image distortion.

Polysulfones are also moisture sensitive, and their coating and registration characteristics change with humidity. This problem in addition to those noted above are not encountered with the depolymerizable polymers of the present invention.

SUMMARY OF THE INVENTION

The present invention provides a novel process for forming metal patterns on a substrate wherein a thermally depolymerizable polymer is deposited as high molecular weight species, to take advantage of its good film forming and adhesion properties, treated thermally to depolymerize and vaporize the bulk of the thermally depolymerizable polymer, whereupon the resulting residual organic film is of sufficiently low molecular weight and is sufficiently reduced in mass throughout so as to be rapidly lifted-off in solvents, which do not substantially swell any other polymers materials present, e.g., a polyimide, to cleanly remove a metal layer overlying the thermally depolymerizable polymer layer or layers overlying the thermally depolymerizable polymer layer which include a metal layer to provide an exposed surface free from polymeric residues.

Per the present invention, it has been found that a mask of polymer which is thermally depolymerizable upon heating can be applied to a desired substrate, overlaid with a photoresist, patterned lithographically so as to remove mask material in the desired pattern areas (or vias) and a blanket metallization layer can be applied thereon. Upon heating the substrate to depolymerize the thermally depolymerizable polymer, the molecular weight thereof is sufficiently lowered so that the same can be rapidly swelled and/or dissolved in solvents as above indicated.

In a preferred embodiment, the thermally depolymerizable polymer is blanket coated onto the substrate, a reactive ion etching (RIE) etch stop barrier is formed on the thermally depolymerizable polymer and patterns created through the polymer and etch stop barrier using lithographic techniques. Blanket metal is vapor deposited onto the surface thereby filling in the lithographically defined and etched pattern. After metal deposition, the sample is heated to lower the molecular weight of the polymer (thermally depolymerize the polymer). The residual organic film is of sufficiently low molecular weight and is sufficiently reduced in mass throughout to be rapidly dissolved at mild conditions in mild solvents which are not highly polar. The metal-RIE etch barrier-polymer laminate is readily removed leaving behind the well-adhered metal pattern deposited through the pattern.

A preferred embodiment of the present invention involves an annealing, bake-out process subsequent to formation of the layer of thermally depolymerizable polymer but prior to thermal depolymerization which reduces outgassing of solvent.

One major object of the present invention is to provide a process for selectively removing at least one layer over a thermally depolymerizable polymer layer which is extremely rapid as compared to current technology.

Another object of the present invention is to provide a process for removing at least one layer over a thermally depolymerizable polymer layer where, following thermal depolymerization, residual polymer is sufficiently soluble so that the same can be dissolved in solvent systems, which solvent systems are not absorbed by organic dielectric layers or organic barrier layers, for example, such layers formed of a polyimide.

Yet another object of the present invention is to provide such a process which does not require the use of hot polymer dissolution solvents or vigorous dissolution techniques such as ultrasonic vibration to promote lift-off, though such could be used if desired.

Another object of the present invention is to provide a process whereby following solvent-assisted lift-off no thermally depolymerizable polymer residue remains.

DESCRIPTION OF PREFERRED EMBODIMENTS

The major object of the present invention is to permit selective removal of a blanket metallization layer leaving behind metallized areas, e.g., metallized vias, utilizing a sacrificial lift-off layer of a thermally depolymerizable polymer.

While not to be construed as limitative, the present invention is explained below with reference to a simplified assembly which comprises an inorganic substrate or the like. Overcoated thereon, for purposes of illustration, is a thermally depolymerizable polymer such as high molecular weight polymethylmethacrylate or poly-α-methylstyrene.

Since, as earlier indicated, preferably a conventional RIE is used per the present invention, it is most preferred that an RIE etch stop barrier be introduced between the layer of thermally depolymerizable polymer and blanket metallization. While it should be understood that where RIE is not used the RIE etch stop barrier is optional, since this is a highly preferred form of the present invention the following discussion will often be in terms of such an RIE etch stop barrier.

The thermally depolymerizable polymer is typically applied to the substrate (typically an inorganic insulating layer, though the same could be a conductive layer or an insulating organic layer) in the form of an organic solution and the solvent evaporated off to yield a dry layer of the thermally depolymerizable polymer. In the preferred embodiment of the present invention, the RIE etch stop barrier is then formed on the thermally depolymerizable polymer layer, and the resulting assembly is overlaid with a conventional photoresist which is exposed through a mask, typically with UV radiation, in a conventional manner to create a pattern. The pattern is chemically etched through the photoresist to the RIE etch stop barrier layer where present (typically $SiO_2$) and then transferred through the lift-off layer(s) to the inorganic substrate by a conventional reactive ion etching technique. Thus, when the blanket metallization layer is applied, it will simultaneously be deposited in the via hole, typically on another metallurgical line though this is not mandatory, and will also be deposited on the thermally depolymerizable polymer layer of, if present, the RIE etch stop layer.

It being understood that per the present invention in a preferred embodiment an RIE etch stop barrier is formed under the blanket metallization layer and over the thermally depolymerizable polymer layer, the following simplified discussion is offered where the RIE etch stop barrier is not discussed in all instances in detail except for a discussion of representative RIE etch stop barriers and the working example. It should be understood, however, that following thermally depolymerization and solvent lift-off of the blanket metallization layer, both the blanket metallization layer and the RIE etch stop barrier are removed from the thermally depolymerized polymer layer in a manner as explained for the blanket metallization layer per se.

Typically, though not mandatorily, an additional RIE etch stop barrier layer will be present under the thermally depolymerizable polymer layer. This is preferred because when the thermally depolymerizable polymer layer is removed, one is left with an insulating layer, typically of a material such as $SiO_2$ or $Si_3N_4$. Thus, if it is desired to provide additional layers, there is still an RIE etch stop layer which can be used to prevent RIE etching of layers thereunder.

Following formation of the thermally depolymerizable polymer in the desired masking pattern, i.e., depolymerizable polymer is not permitted to remain in areas where metallization is to remain, a blanket metallization layer is applied thereover or over the optimal RIE etch stop barrier layer.

As one skilled in the art will appreciate, of course, additional conventional layers can be applied in a conventional manner as desired, since, according to the present invention, all layers over areas where thermally depolymerizable polymer is permitted to remain will be lifted off following thermal polymerization and dissolution.

The thermal depolymerization of the present invention renders the thermally depolymerizable polymer sufficiently soluble and reduced in mass throughout so as to permit rapid dissolution or lift-off by a solvent soak within seconds. This obviates the requirement for hot solvents or vigorous dissolution techniques such as ultrasonic vibration to hasten lift-off. Ultrasonic vibration is a high energy process whereby the cavitating liquid is capable of disrupting adhesion at interfaces, generating and propagating cracks in organic and inorganic layers and, as such, is generally not preferred in semiconductor device and packaging, e.g., ceramic substrate, applications. Although generally non-preferred, as one skilled in the art will appreciate, hot solvents, wet etchants and/or vibration can be used.

The blanket metallization layer is removed in all areas where the thermally depolymerizable polymer has been removed, leaving blanket metallization selectively in those areas where thermally depolymerized polymer was not present, e.g., at metallized vias, where excellent metal adhesion is obtained.

Various parameters of the present invention are now explored in more detail.

THE SURFACE OR SUBSTRATE

The surface to which the thermally depolymerizable polymer is applied means any layer(s) beneath the depolymerizable polymer which permits initial adhesion thereto but which permits thermal depolymerization.

Hereafter, this surface is often referred to as a substrate; when the term "SC substrate" is used, this refers to an inorganic substrate as is used in the semiconductor and packaging art which, while the same may be substrate per the present invention, is more typically merely one component thereof.

The substrate per the present invention typically comprises an SC substrate as is used in semiconductor and packaging manufacture. Such SC substrates typically show a coefficient of thermal expansion on the order of 3 to $20 \times 10^{-6}/°$ C. or less. While not limitative in any fashion, typically commercially used SC substrates for the manufacture of microelectronic devices and packaging structures include silicon, silicon nitride, ceramics such as $Al_2O_3$, glass-ceramics, etc., and the like.

As will be appreciated by one skilled in the art, in the context of the present invention the term substrate includes a layer or layers which, in fact, is/are formed on an underlying substrate per se, e.g., a layer such as silicon dioxide, silicon nitride and the like. It is well known that such materials serve a chemically passivating function in microelectronic devices and packaging structures.

The present invention not only finds application where the thermally depolymerizable layer is applied to an inorganic substrate but also finds application in the situation where the thermally depolymerizable polymer is applied to a polymer substrate such as a polyimide used for passivating or dielectric effects in a semiconductor device or packaging structure. Other useful polymers include high temperature stable organic materials with low dielectric constants ($<3.6$) such as polyquinoxalines, polyphenylenes, etc. Processing parameters are the same as for a device or packaging structure involving only inorganic materials. Of course, any heating conditions should not degrade such any polymer and the polymer should be sufficiently thermally stable so as not to decompose and/or outgas during deposition of the RIE etch stop barrier layer or during deposition of the blanket metal layer.

In addition, of course, it would be possible to use organometallic materials under and/or over the thermally depolymerizable polymer layer which would be converted during processing to more of an inorganic material, e.g., the ratio of carbon to silicon would be decreased.

THE THERMALLY DEPOLYMERIZABLE POLYMER

Per the present invention, the thermally depolymerizable polymer or copolymer or blends thereof is partially depolymerized, i.e., its molecular weight is lowered to a degree sufficient so that the overlying blanket metallization layer and, if present, the RIE etch stop barrier and other layers present thereover, can be removed by a simple solvent soak since the thermal depolymerization renders the resulting thermally depolymerized polymer soluble and in mild solvents at low temperature in a very short period of time, preferably leaving no residue. As will be appreciated by one skilled in the art, in any copolymer or blend at least one moiety must be capable of thermal depolymerization.

The thermally depolymerizable polymers illustrate the following physical characteristics:

(1) Good film-forming properties, e.g., the ability to form smooth, defect-free films when spun or sprayed from solution onto an $SiO_2$ or $Si_3N_4$ surface. This is directly related to molecular weight, molecular weight distribution, glass transition temperature ($T_g$) and degree of crystallinity.

(2) Good adhesion to $SiO_2$, $Si_3N_4$ and other inorganic and organic materials.

(3) Solubility in mild solvents that do not substantially swell other polymers present.

(4) A sufficiently high Tg so that the etched vias do not flow or deform during any high temperature step, e.g., a high temperature metal deposition step.

(5) Sufficiently high depolymerization temperature so that depolymerization does not occur to any substantial degree, and preferably does not occur, prior to lift-off and interfere with intermediate processing.

Usually the thermally depolymerizable polymer is selected so that thermal depolymerization is initiated at a temperature at least 50° C. greater than the temperature at which the RIE etch stop barrier layer (in the preferred embodiment) or the blanket metallization layer is deposited. This temperature range provides a sufficient safety factor so that any imprecision in the temperatures of high temperature deposition steps should be accounted for.

Such polymers generally fall within a class having the following regular structure:

$X = CH_3$, CN, $CF_3$ tert-butyl, etc.

where X is as above defined, etc.

X and Y represent any substituent that:

(1) Is itself thermally stable and cannot be cleaved from the polymer backbone upon heating at conditions as are used in the present invention;

(2) Serves as a stabilizing group to vinyl groups so that the depolymerized unit below is stabilized, but is not so stabilizing as to prevent initial polymerization:

and n is selected so as to most preferably provide a molecular weight as later discussed.

Currently most preferred thermally depolymerizable polymers are polymethylmethacrylate and poly-α-methylstyrene.

Polymethylmethacrylate (hereafter often PMMA) and poly-α methylstyrene (hereafter often PαMS) are the most preferred depolymerizable polymers per the present invention since they show the highest depolymerization temperature (T2) and also the highest Tg values of the materials we have evaluated to date. For example, polyisobutylene (hereafter often PIB) has a sufficiently high T2, but its Tg value of $-73°$ C. is so low that vias "blur" due to polymer flow at temperatures as are typically required for metallization, e.g., 150°–220° C.

Optimally the thermally depolymerizable polymer should not depolymerize below a given threshold temperature that is above the highest temperature that the structure is exposed to during processing. The most critical processing step, in terms of thermal requirements, is typically the metal deposition step. The thermally depolymerizable polymer should not outgas appreciably at any high temperature step or organic vapor may interfere with metal integrity in vias. The results of TGA analysis for certain polymers are set forth in the following table where all temperatures are in °C.

TABLE 1

| Polymer | Molecular Weight | $T_1$ | $T_2$ | $T_F$ | $T_g$ |
|---|---|---|---|---|---|
| Polyisobutylene (PIB) | 125,000 | 92 | 220 | 365 | $-73$ |
| Poly-α-methyl-styrene(PαMS) | 20,000 | 155 | 295 | 360 | av ~168 |
| PαMS | 125,000 | 150 | 280 | 360 | |
| PαMS | 587,000 | 150 | 250 | 350 | |
| Polymethyl methacryate (PMMA) | 600,000 | 150* | 275 | 430 | av ~105 |
| PMMA | — | 150 | 290 | 425 | |
| PMMA | 81,800 | 100 | 315 | 430 | |
| Polybutylmethacrylate | — | 150 | 200 | 430 | av ~0 |
| Polypropylmethacrylate | — | 160 | 210 | 430 | 35° |

$T_1$ = Outgassing of solvent - if polymer films are pre-baked to 260° C., all $T_1$ values rose to equal those of $T_2$.
$T_2$ = Temperature at which rapid weight loss occurs - represents depolymerization.
$T_F$ = Temperature at which 100% weight loss occurred.

In the following table, typical metal systems and deposition temperatures are given.

TABLE 2

| Metal | Maximum Deposition Temperature °C.-$T_D$ | Time at $T_D$ |
|---|---|---|
| Ti—Cu—Au | 100° | 2–5 min. |
| Al—Cu | 180° | 2–5 min. |

TABLE 2-continued

| Metal | Maximum Deposition Temperature °C.-$T_D$ | Time at $T_D$ |
|---|---|---|
| Cr—Cu—Cr | 220° C. | 2–60 min. |

The molecular weight of the thermally depolymerizable polymers of the present invention is not unduly limited, but typically is on the order of about 2,000 to about 1,000,000, more preferably from about 15,000 or about 20,000 to about 50,000 determined by the GPC (gel permeation chromatography) method. Molecular weights are not unduly limited since the primary criterion which the thermally depolymerizable polymer exhibits is, of course, the ability to thermally depolymerize so that at areas where the blanket metallization layer or RIE etch stop barrier layer is to selectively remain there is a clean line of demarcation between the remaining metallization layer and areas where the blanket metallization layer is removed by solvent lift-off following thermal depolymerization. As one skilled in the art will appreciate, at lower molecular weights typically thermal depolymerization will require shorter heat treatments. Unless otherwise indicated, all molecular weight herein are weight average molecular weights.

We currently believed that it is most preferred that the thermally depolymerizable polymer, following thermal depolymerization, be reduced in molecular weight to a molecular weight on the order of from about 500 to about 10,000 more preferably from 500 to 5,000.

Generally, the thermally depolymerizable polymer is applied from a solution thereof in an organic solvent which permits uniform and easy coating of the thermally depolymerization polymer. Such solvents are not unduly limited.

Typically, solvents used are toluene, xylene, benzyl alcohol and 2-methoxyethylether (diglyme) which will readily dissolved poly-α-methylstyrene and similar substituted aromatic polymers. Generally a slightly more polar solvent such as benzyl alcohol is required to dissolve a polymer such as polymethylmethacrylate.

The thermally depolymerizable polymers of the present invention can be applied by spinning, meniscus coating, etc., from an organic solvent as above described, typically from toluene or diglyme.

The thermally depolymerizable polymer can be coated at a polymer level in the solvent which permits uniform and efficient coating; as will be appreciated by one skilled in the art, this is not unduly limited, and we have found that, typically, thermally depolymerizable polymer percentages on the order of about 20 to about 60, more preferably from 30 to 50, are easily worked with. Basis is polymer weight based on total solution weight.

If desired, mixtures of thermally depolymerizable polymers and/or mixtures of solvents can be used, though using mixtures of solvents may complicate drying. However, certain advantages can be encountered upon the use of such mixtures such as improved solubilization of polymer mixtures of different polarity. In those instances where potentially one might find adhesion between the depolymerizable polymer and a layer thereunder or thereover insufficient for some processing step, an adhesion promoter can be used.

The thermally depolymerizable polymers per the present invention are also high resolution photoresist materials, typically being exposed to ultraviolet radiation in a conventional manner.

After ultraviolet exposure, the imaged areas can be developed out (removed) by simple heating in a conventional manner. In this instance, the use of a photoresist to form the via patterns is not necessary since the depolymerizable polymer per se serves as a photomask.

The Optional, but Preferred, RIE Etch Stop Barrier Layer

The reason that an RIE etch stop barrier layer is highly preferred is that RIE is the preferred etching means used in the present invention.

Organic materials are typically RIE etched using an oxygen atmosphere in a conventional manner. Thus, oxygen RIE etching will remove the photomask in all desired areas. However, the oxygen RIE etch would also remove the thermally depolymerizable polymer if an RIE stop etch barrier were not present. Useful reactive ion etching techniques are disclosed "A Survey of Plasma-Etching Processes" by Richard L. Bersin, published in Solid State Technology, May 1976, pages 31–36, and "Reactive Ion Etching in Chlorinated Plasma" by Geraldine C. Schwartz et al, Solid State Technology, November 1980, pages 85–91, both incorporated by reference.

Accordingly, a conventional RIE etch stop barrier is provided over the depolymerizable polymer layer which will, following selective removal of the photoresist be used to form the via hole and protect the thermally depolymerizable polymer thereunder.

The RIE etch stop barrier can be formed of many conventional etch stop barrier materials, for example, $SiO_2$ by a conventional CVD process, $Si_3N_4$ formed by a conventional plasma assisted CVD process, etc. Thicknesses are not limited so long as to etch stop barrier function is exhibited, keeping in mind that this layer itself will be RIE etched in an atmosphere other than oxygen and undue thicknesses are not necessary. Typically thicknesses will be on the order of about 1,000 to about 4,000 Å, more generally on the order of about 2,000 Å.

The Blanket Metallization Layer

The blanket metallization layer of the present invention is merely selected from metals as are used to form metallization patterns in the semiconductor or packaging manufacturing art.

Representative of such metals are Al, Al—Cu, Ti—Cu—Al, Cu, etc.

The conditions of depositing the blanket metallization layer are not overly important so long as thermal depolymerization does not occur during the deposition to any substantial degree, and preferably does not occur at all.

Typical processes used for the deposition of the blanket metallization layer include vapor deposition, with typically temperatures no greater than about 220° C. being used, e.g., about 160° C. average. Note earlier presented TABLE 2 in this regard.

As one skilled in the art will appreciate, since the via hole has been etched down to the desired layer, typically a SC substrate (or any passivating layer thereover) prior to deposition of the blanket metallization layer, the blanket metallization layer will not only deposit on the thermally depolymerizable polymer layer (or RIE etch stop barrier layer where present), but will also be deposited in the via hole on the desired surface, typically metallurgy.

Optional Bake-Out Processing

As earlier indicated, it is most preferred in accordance with the present invention that subsequent to the formation of the thermally depolymerizable polymer layer but prior to thermal depolymerization the layer of thermally depolymerizable polymer be subjected to an annealing, bake-out process to reduce outgassing.

In this most preferred, but optional, embodiment of the present invention, the deposited thermally depolymerizable polymer layer is gradually heated, e.g., over a period of from about 10 minutes to about 20 hours to a temperature on the order of about 100° C. to about 300° C., most preferably about 260° C., and then is maintained at that elevated temperature for about 2 to about 20 minutes, most preferably for 15 minutes at 260° C. to remove any contaminating process solvents and depolymerize and volatilize low molecular weight polymer fractions.

Generally we do not process at temperatures near the upper end of the above ranges in order to avoid substantial thermal depolymerization during the annealing, bake-out processing of the present invention. So long as no substantial thermal depolymerization occurs during the annealing, bake-out processing of the present invention, the exact temperature selected is not overly important.

Further, as the later discussion will make clear, usually we use a "stepped" annealing, bake-out. While this is not mandatory, we believe that the use of a stepped temperature profile avoids the possibility of any rapid outgassing during the annealing, bake-out processing of the present invention which potentially might lead to blisters, voids or the like. Where this is not a problem, obviously there is no need to go to a more complicated stepped annealing, bake-out processing.

The TGA data summarized in the following TABLE 3 shows that after such treatment, PαMS (Molecular weight: 20,000) does not show any detectable weight loss for 60 minutes at 220° C. during isothermal TGA analysis. PMMA still showed residual outgassing at 220° C. even after baking at 280° C. for 90 minutes, but no such outgassing at 190° C. In TABLE 3 below, the arrow between 25 and 280 or 260 indicates that the thermally depolymerizable polymer is taken from ambient to the indicated temperature. The numeral 60 or 90 under the column heading $TIME_{MIN}$ indicates the time that the thermally depolymerizable polymer is held at the indicated temperature.

The %WT. LOSS column indicates the percent weight lost during the particular step, e.g., for PMMA HIGH in going from 25° to 280° C. the thermally depolymerizable polymer showed an 11% weight loss, showed a 20% weight loss while being held at 280° C. for 60 minutes and showed a 5.5% weight loss while being held at 220° C. for 60 minutes.

The temperature given under the column heading T represents the temperature at which the thermally depolymerizable polymer shows a 2% weight loss without the annealing, bake-out processing of the present invention. On the other hand, the temperature under the column heading $T^1$ indicates the temperature at which a thermally depolymerizable polymer which has been subjected to the annealing, bake-out processing of the present invention shows a 2% weight loss. It is easily seen that in all instances where this comparison was performed $T^1$ is substantially greater than T.

TABLE 3

| POLYMER | TEMP. °C. | TIME$_{MIN.}$ | % WT. LOSS | T °C. | $T^1$ °C. |
|---|---|---|---|---|---|
| PMMA HIGH | 25 | → 280° | 11 | | |
| | 280 | 60 | 20 | 150 | 325 |
| | 220 | 60 | 5.5 | | |
| PMMA 81,000 | 25 | → 280° | 9 | | |
| | 280 | 90 | 23 | 315 | 345 |
| | 220 | 60 | 5.7 | | |
| PαMS 20,000 | 25 | → 280° | 16 | 295 | 325 |
| | 280 | 60 | 68 | | |
| | 220 | 60 | 0 | | |
| PMMA 81,000 | 25 | → 260° | 8 | | 345 |
| | 260 | 60 | 16.3 | | |
| | 220 | 60 | 5.3 | | |
| | 190 | 60 | 0 | | |
| POMS 20,000 | 25 | → 260° | 12 | | 330 |
| | 260 | 60 | 4.5 | | |
| | 220 | 60 | 0 | | |

A typical annealing, bake-out processing scheme is given below:

TABLE 4

| Temperature °C. | Time Min. |
|---|---|
| 85 | 30 min. |
| 100 | 30 min. |
| 150 | 30 min. |
| 200 | 30 min. |
| 240–260 | 60 min. |

Following the annealing, bake-out procedure above, the adhesion of the thermally depolymerizable polymers of the present invention to substrate such as $SiO_2$ and $Si_3N_4$ is very good residual casting solvents such as toluene (PαMS) and diglyme (PMMA) are completely removed from the films and the annealed films readily dissolve in appropriate solvents which do not swell other polymers present such as polyimide, e.g., diglyme and toluene.

Per the present invention the annealing, bake-out processing of the present invention is generally separate from thermal depolymerization. It is generally used to ensure good adherence to any layer deposited on the thermally depolymerizable polymer, for example, the blanket metallization layer, the RIE etch stop layer, etc. If contaminating process solvents or the like are present in the thermally depolymerizable polymer layer when a subsequent high temperature deposition step is conducted, they might outgas during such high temperature processing step and lead to non-uniform deposition. By conducting the annealing, bake-out processing of the present invention, any such problems are avoided. Of course, following the annealing, bake-out processing of the present invention, there generally should be no further blanket solvent exposure as this might lead to the reintroduction of contaminating process solvents. The annealing, bake-out processing of the present invention is, of course, conducted at a temperature which is selected for the thermally depolymerizable polymer being used so that minimal premature thermal depolymerization occurs.

The annealing, bake-out processing of the present invention is conducted in a conventional inert atmosphere such as nitrogen, argon, etc.

While we do not wish to be precisely bound as to when solvent removal ceases and thermal depolymerization begins, we currently believe that at temperatures below about 250° C. the primary effect is solvent removal whereas at temperatures above about 280° C., the primary effect is thermal depolymerization.

Dimensions

As will be appreciated by one skilled in the art, the exact thickness of the substrate is not overly important and is as is typically used in the art to form semiconductor or packaging devices.

The blanket metallization layer is, again, merely selected to have a thickness as is typically used in the art for metallization layers. Again, this is not limitative, and generally is on the order of 2000 Å to 10 μm.

The thermally depolymerizable polymer is merely used at a thickness which will ensure continuous coating in those areas where metal lift-off is desired and at a thickness sufficient to prevent penetration of the blanket metallization layer therethrough. This thickness will depend upon the depolymerizable polymer used, and will typically be on the order of 0.6 μm to about 15 μm, more preferably from 2 μm to 8 μm. These thicknesses are not limitative and greater and lesser thicknesses can be determined with ease by one skilled in the art.

Thermal Depolymerization Conditions

The thermal depolymerization technique of the present invention involves heating to induce depolymerization of the thermally depolymerizable polymer layer.

In fact, in those instances where the rapidity of depolymerization can be assisted by irradiation, an appropriate radiation source could be used in combination with an appropriate heating source, for example, where the depolymerizable polymer is depolymerized by electron beams, such could be used in combination with a different conventional heating source.

The thermally depolymerizable layer can be heated in any desired fashion. Typically the device comprising the thermally depolymerizable polymer layer is heated on a quartz sled in a conventional furnace. It is not harmful to heat the blanket metallization layer or the RIE etch stop barrier layer, when present, at the same time. Typically, heating is in an inert gas or reducing atmosphere, such as nitrogen, argon, hydrogen, etc., at a temperature sufficient to depolymerize the thermally depolymerizable polymer. Usually an inert or reducing atmosphere is used where air or vacuum might harm the metallurgy involved. Insofar as the thermally depolymerizable per se is concerned, heating could also be in air or in a vacuum.

Usually, heating is at a temperature of from about 280° C. to about 330° C. for a period of time of from about 5 minutes to about 30 minutes. Generally, at higher temperatures shorter times will be used and at lower temperatures longer times will be used. In most instances, heating at from 300° C. to 320° C. for about 10 to 15 minutes will be sufficient.

Depolymerization essentially results in a change in the solubility of, and a reduction in the mass, of the thermally depolymerizable polymer layer as earlier explained. The thermally depolymerizable polymers of the present invention are often inherently unzippable, i.e., they often can be inherently converted to the corresponding gaseous monomer(s). Thermal depolymerization requires, however, only a brief heat to a minimum temperature as compared to the conditions required for complete unzipping.

Solvent-Assisted Lift Off

Lift-off of the blanket metallization layers and other layers over the thermally depolymerizable layer following thermally depolymerization is solvent-assisted. Hereafter for brevity this is merely referred to as solvent lift-off.

After heating to the desired temperature and effecting depolymerization of the depolymerizable polymer layer, the device is withdrawn from the heating zone and subjected to the solvent lift-off procedure of the present invention whereupon all layers overlying the areas of thermally depolymerizable polymer are cleanly lifted off to permit the desired metallization pattern, typically metallized vias, to remain. It is to be particularly noted that in accordance with the present invention a static solvent lift-off procedure can be used, though of course this is not mandatory.

Solvent lift-off is very rapid. Typically it is completed within a period of time of from about 5 seconds to about 2 minutes.

Solvent lift-off is most preferably at a low temperature, for example, most preferably at room temperature. This is one major advantage of the present invention as compared to prior art procedures. However, if desired, solvent lift-off can be conducted at temperatures up to about 100° C., more desirably at temperatures of from about room temperature (25° C.) to a temperature no higher than 50° C.

Solvent lift-off is typically conducted at ambient pressure. At present, we see no benefits to conducting solvent lift-off at sub- or super-atmospheric pressure, but such are not excluded.

The solvents used are mild solvents and can exhibit varying degrees of polarity. The solvent (or solvents) used is selected so that it selectively effects the thermally depolymerized polymer to assist in the lift-off thereof but does not swell any other high molecular weight organic based dielectric materials which are present, for example, a polyimide or the like. Depending upon such other high molecular weight organic based dielectrics which are present, generally the greater the difference of the solubility parameter of the solvent to such other high molecular weight dielectrics which are present the better since the solvent will not swell or dissolve the same. Usually the solvent selected for the solvent lift-off is the same as the casting solvent used to form the thermally depolymerizable layer. Thus, the solvent which is selected for the solvent lift-off is most desirably a solvent for the thermally depolymerized polymer but a precipitant for any other high molecular dielectric materials which are present, e.g., a polyquinoline, a polyphenylene, a polypyrrol, a copolymer with an organometallic material, etc.

The nature of the solvent is not unduly limited so long as it does not affect in a harmful manner device components other than the thermally depolymerized polymer layer. In the sense that the thermally depolymerized polymer is removed, the effect of the solvent can in that sense be viewed as "harmful".

Currently preferred solvents include diglyme and toluene.

The conditions for solvent lift-off of the thermally depolymerized polymer are sensitive to the following parameters and can be controlled by adjusting these properties and conditions:

The thickness of the thermally depolymerizable polymer layer is not unduly unlimited, the most important criterion being that the thermally depolymerizable polymer layer be pinhole free. Typical thicknesses have earlier been given.

Typically thinner films can be lifted-off more rapidly than thicker films. For example, a 2 μm film can be lifted-off more rapidly than a 3.8 μm film.

Higher molecular weight polymers dissolve more slowly than lower molecular weight polymers and, accordingly, the lift-off time is longer. Molecular weight distribution also affects the lift-off in that low molecular weight fractions facilitate a faster lift-off.

The duration of the thermal depolymerization step also affects lift-off time. A longer thermal depolymerization results in a greater molecular weight reduction and increased solubility, i.e., a more rapid lift-off time.

The temperature of thermal depolymerization also can affect the lift-off conditions in that higher temperatures result in a more rapid and complete thermal depolymerization, i.e., result in a more rapid lift-off. It is most preferred, of course, that following solvent lift-off no thermally depolymerizable polymer residue remain. However, in those rare instances where residue remains, such can be easily removed by a conventional plasma ashing with oxygen or air.

Figure 1:
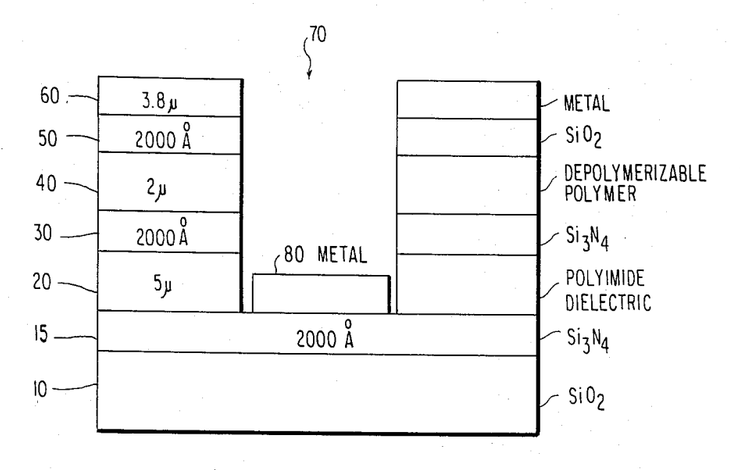
The FIGURE is a cross-sectional schematic view of a typical intermediate of a device formed using the process of the present invention just prior to blanket metallization lift-off.

As one skilled in the art will appreciate, the following FIGURE illustrates a relatively complicated embodiment of the present invention. The present invention is not, of course, limited to such relatively complicated devices or packaging structures. For example, the present invention would find application with a device intermediate which comprises $SiO_2$ layer 10, $Si_3N_4$ layer 15, thermally depolymerizable polymer layer 40, $SiO_2$ layer 50 and metal layer 60 with metal layer 80 being deposited on $Si_3N_4$ layer 15. Following solvent lift-off, only metal layer 80 would be left remaining on $Si_3N_4$ layer 15. One might vary layer thicknesses for this embodiment so that the depolymerizable polymer layer would be 3.8 microns thick but otherwise dimensions are as given for the FIGURE. In the working example, the simplified structure is referred to as Structure 1 and the structure described below with reference to the FIGURE is referred to as Structure 2.

The FIGURE shows a typical device just prior to blanket metallization layer lift-off. As will be appreciated by one skilled in the art, the device is schematic and is conventional except for the depolymerizable polymer of the present invention.

Not shown in the FIGURE is a conventional silicon substrate or ceramic as would typically be used for device or package fabrication. Overlying thereover is an $SiO_2$ layer 10 which in turn has a passivating layer of $Si_3N_4$ about 2000 Å thick, formed in a conventional manner. Typically a conventional polyimide dielectric layer 20 is formed having a thickness of about 5 μm. A conventional $Si_3N_4$ layer 30 about 2000 Å thick is shown deposited thereon, the same being formed in a conventional manner. A layer of thermally depolymerizable polymer 40 about 2 μm thick is shown formed on layer 30. Typically this is formed by casting as earlier explained. RIE etch stop barrier layer 50 is shown formed on thermally depolymerizable polymer layer 30. Typically this is $SiO_2$ formed by CVD in a conventional manner about 2000 Å thick. On top of layer 50 there is shown the remaining portions of the blanket metallization layer about 3.8 μm thick indicated by numeral 60. Finally, in via hole 70 there is shown metal 80 which results from the blanket metallization layer deposition.

As one skilled in the art will appreciate, the inorganic layers, i.e., $SiO_2$ layer 50 and $Si_3N_4$ layer 30 have been removed by a conventional $CF_4$ RIE whereas organic layers 40 and 20 have, prior to blanket metallization deposition, been removed with a conventional oxygen RIE.

As one skilled in the art will further appreciate, metal 80 in via 70 is spaced a slight distance from the polyimide dielectric.

If desired, of course, the above structure can be repeated a plurality of times to achieve "lift-off" effects wherever a blanket metallization layer-thermally depolymerizable polymer combination exists.

Having thus generally described the invention, the following working example is offered to illustrate the same. In the following, a structure is described which is merely representative of an actual device or package structure, as will be appreciated by one skilled in the art. However, this example does accurately illustrate the essential processing steps of the present invention.

EXAMPLE

The substrate selected was a layered structure as shown in the FIGURE. Unless otherwise indicated, all dimensions are per the FIGURE and were formed in a conventional manner. All layers were formed in a conventional manner.

The thermally depolymerizable polymers selected were polymethylmethacrylate and poly-α-methylstryene. They had molecular weights as shown in the later presented Table 5 determined by the GPC method. 25% by weight solutions of the depolymerizable polymers in 2-methoxyethylether (diglyme) and toluene, respectively, were formed (basis: total solution weight) by dissolving the polymer therein at the following conditions: shaking for 16 hours at room temperature.

The solution was spun onto the $Si_3N_4$ layer at ambient temperature and pressure and subjected to a preliminary drying to effect preliminary solvent removal at a temperature of about 70° C. for about 20 minutes to form the thermally depolymerizable polymer layer.

Following drying, the thermally depolymerizable polymer layer was subjected to the annealing, bake-out processing of the present invention in nitrogen. Heating between individual temperature stages was rapid and the time to raise from one temperature to the next temperature is unimportant. Typically it is on the order of a few minutes. The heating regimen was: ambient to 70° C., remain at 70° C. for twenty minutes; 70° C. to 150° C., remain at 150° C. for one-half hour; 150° C. to 200° C., remain at 200° C. for one hour; 200° C. to 260° C., remain at 260° C. for one hour. The device was then permitted to naturally cool and cooled from 260° C. to ambient in about 15 minutes. If desired, a rapid cool can be used to a temperature about 10° C. over the Tg of the thermally depolymerizable polymer, and then the above natural cool can be used. The rate of cooling is relatively unimportant so long as, of course, it is not so high that cracking or the like results in the thermally depolymerizable layer of contiguous layer(s).

Following processing as above, no distortion, blistering, pinholes or the like were noted in the thermally depolymerizable polymer layer, i.e., it was defect-free.

The $SiO_2$ RIE etch stop barrier was then formed by CVD. A conventional photoresist was then applied, exposed through a mask in a conventional manner and removed in a conventional manner to expose desired areas for subsequent RIE etching.

The RIE exposed RIE etch barrier was then removed with a conventional $CF_4$ RIE etch and then the thermally depolymerizable polymer layer was removed by conventional RIE using $O_2$.

Following the above, a blanket metallization layer of Al or Al—Cu was formed over the complete surface of the substrate (areas coated and uncoated with thermally depolymerizable polymer) and overlying $SiO_2$ to a thickness per Structure 1 or 2 using a conventional vacuum evaporation at 180° C. and then subjected to thermal depolymerization in nitrogen at the conditions given in Table 5 where "Solvent Only" represents the time required to effect solvent removal in the absence of thermal depolymerization, "Depolymerization" represents the time at depolymerization conditions and "Solvent Assisted Lift-Off" represents the time for liff-off of the thermally depolymerized layer. Lift-off was at ambient temperature and pressure without agitation. Structure 1 and Structure 2 have earlier been identified.

TABLE 5

| Structure | Polymer* | Solvent Only (Minutes) | Depolymerization Temperature and Time | Solvent Assisted Lift-Off |
|---|---|---|---|---|
| 1 | PαMS 587 M.W. | 30–60 | 350° C. 15 min. | 15 sec. toluene |
| 1 | PMMA high | 72 hr. | 350° C. 40 min. | 2 min. diglyme |
| 1 | PMMA 81 M.W. | 60 min. | 290  15 min. | 10 min. diglyme |
| 2 | PMMA high | 60 min. | 290  15 min. | 10 sec. diglyme |
| 2 | PMMA 81 M.W. | 60 min. | 290  15 min. | 10 sec. diglyme |
| 2 | PαMS 20 M.W. | 60 min. | 290  15 min. | 10 sec. toluene |

*Molecular weights are × 1,000

Following processing as above, any layer(s) over the thermally depolymerized polymer was/were cleanly lifted off from the underlying layer in the lift-off solvent (static soak), leaving metallized vias of good morphological quality which were not delaminated and which exhibited excellent metal adhesion to the underlying layer.

Similar results have been obtained using Ti—Cu—Au metallurgy which was electron beam deposited at 100° C. with Structure 1 and Structure 2, with Structure 2 involving Al—Cu metallurgy deposited at 220° C. and with Structure 2 using Cr—Cu—Cr metallurgy deposited at 180° C., albeit with Al—Cu metallurgy blistering was noted.

In all instances the $Si_3N_4$ layer in all Structure 2 samples was smooth and without cracks, indicating the absence of polyimide swelling and subsequent $Si_3N_4$ cracking.

Of significant importance is the fact that in all samples, be they of the Structure 1 or Structure 2 type, the remaining metallization patterns were crisp, complete and undistorted. Even in the above indicated Al—Cu metallization system of the Structure 2 type, where the sacrificial blanket metallization layer was blistered, presumably due to outgassing, the metallized vias were unaffected.

While there have been described what are at present considered to be the preferred embodiments of this invention, it will be obvious to those skilled in the art that various changes and modifications may be made therein without departing from the invention, and it is therefore, intended to cover all such changes and modifications as fall within the true spirit and scope of the invention.

We claim:

1. A process for forming a metal pattern on a substrate which comprises:
   forming a mask of at least one thermally depolymerizable polymer on the substrate with a pattern of openings complementary to the desired metal pattern;
   blanket coating the substrate and the mask with a metal;
   heating to thermally depolymerize the thermally depolymerizable polymer; and
   thereafter immersing the resulting assembly in a solvent to lift-off the depolymerized polymer and any metal thereover leaving metal in the desired pattern on the substrate.

2. The process of claim 1 wherein the depolymerizable polymer is selected from the group consisting of polymethylmethacrylate and poly-α-methylstyrene.

3. The process of claim 1 wherein the weight average molecular weight of the depolymerizable polymer is about 2,000 to about 1,000,000.

4. The process of claim 1 wherein the weight average molecular weight of the depolymerizable polymer is about 15,000 to about 50,000.

5. The process of claim 2 wherein the average weight molecular weight of the polymethylmethacrylate is from about 20,000 to about 50,000 and the weight average molecular weight of the poly-α-methylstyrene is from about 20,000 to about 50,000.

6. The process of claim 2 wherein the depolymerizable polymer is polymethylmethacrylate.

7. The process of claim 2 wherein the depolymerizable polymer is poly-α-methylstyrene.

8. The process of claim 1 wherein the heating to thermally depolymerize the depolymerizable polymer is at a temperature of from about 280° to about 330° C.

9. The process of claim 1 wherein the mask is formed by forming a layer of the thermally depolymerizable polymer on the substrate and then removing portions of the layer in areas where the desired metal pattern is to be applied, and subsequent to forming the layer of the thermally depolymerizable polymer, but prior to heating to thermally depolymerize the depolymerizable polymer, heating is conducted at a temperature insufficient to thermally depolymerize the depolymerizable polymer but at a temperature sufficient to cause the residual solvent and other volatile materials to be removed from the thermally depolymerizable polymer.

10. The process of claim 1 wherein the solvent lift-off is conducted at a temperature of from about 25° C. to about 50° C.

11. The process of claim 1 wherein the solvent lift-off is conducted in about 5 seconds to about 2 minutes.

12. The process of claim 1 wherein said substrate is a semiconductor substrate.

13. The process of claim 1 wherein said substrate is an alumina ceramic substrate.

14. The process of claim 1 wherein said substrate is a glass-ceramic substrate.

15. Process according to claim 1, wherein the forming of the mask comprises
   (a) forming a first resist layer comprised of the thermally depolymerizable polymer on the substrate,
   (b) forming a reactive ion etching (RIE) etch stop barrier on the first resist, the barrier being resistant to RIE in an oxygen atmosphere,
   (c) coating the RIE barrier with a photoresist,
   (d) exposing portions of the photoresist and developing the photoresist to remove portions of the photoresist in the areas where the desired metal pattern is to be applied,
   (e) removing the RIE barrier in the areas where the photoresist has been removed, and
   (f) removing the thermally depolymerizable layer by reactive ion etching in an oxygen atmosphere in the areas where the RIE barrier has been removed.

16. Process according to claim 15, wherein before forming the RIE barrier, the first resist layer is heated at a temperature insufficient to thermally depolymerize the depolymerizable polymer, but at a temperature sufficient to cause residual solvent and other volatile materials to be removed from the thermally depolymerizable polymer.

17. Process according to claim 1, wherein the thermally depolymerizable polymer is one in which thermal depolymerization is initiated at a temperature at least 50° C. greater than the temperature at which the blanket metallization is deposited.

18. Process according to claim 1, wherein the heating of the thermally depolymerizable polymer is at a temperature of at least about 280° C.

19. Process according to claim 1, wherein solvent lift-off is conducted at about room temperature.

20. Process according to claim 1, wherein the solvent for the solvent lift-off is diglyme or toluene.

21. Process as defined in claim 1, wherein the solvent lift-off is conducted at a temperature of from about 25° C. to about 50° C.

22. Process according to claim 1, wherein the solvent for the solvent lift-off does not swell any other high molecular weight organic based dielectric materials or organic barrier layers present.

23. Process according to claim 1, wherein the thermally depolymerizable polymer is an unzippable polymer.

24. Process according to claim 1, wherein the thermal depolymerization is performed without irradiation.

25. Process according to claim 1, wherein the thermally depolymerizable polymer had the following repeating regular structure:

where X=CH₃, CN, CF₃, tert-butyl and where X is as defined above.

26. Process according to claim 1, wherein the mask further contains a reactive ion etching (RIE) etch stop barrier on top of the thermally depolymerizable polymer.

27. Process according to claim 26, wherein the thermally depolymerizable polymer is one in which thermal depolymerization is initiated at a temperature at least 50° C. greater than the temperature at which the etch stop barrier and blanket metallization are deposited.

* * * * *